United States Patent [19]

Matsushita et al.

[11] Patent Number: 4,992,714
[45] Date of Patent: Feb. 12, 1991

[54] BAND PASS FILTER DEVICE AND A METHOD OF FILTERING USING SUCH A DEVICE

[75] Inventors: Osami Matsushita, Tomobe; Michiyuki Takagi, Ushiku; Toyomi Yoshida, Shimoinayoshi; Naohiko Takahashi, Shimoinayoshi; Ikuhiro Saitoh, Shimoinayoshi, all of Japan

[73] Assignee: Hitachi, Ltd., Tokyo, Japan

[21] Appl. No.: 484,911

[22] Filed: Feb. 26, 1990

[30] Foreign Application Priority Data

Mar. 1, 1989 [JP] Japan .................. 1-46529

[51] Int. Cl.$^5$ ............................................. G05B 11/32
[52] U.S. Cl. .................................. 318/625; 310/90.5; 364/508
[58] Field of Search ....................... 318/625; 310/90.5; 364/508

[56] References Cited

U.S. PATENT DOCUMENTS 4,302,813 11/1981 Kurihara et al. ..................... 364/508

Primary Examiner—William M. Shoop, Jr.
Assistant Examiner—Saul M. Bergmann
Attorney, Agent, or Firm—Antonelli, Terry, Stout & Kraus

[57] ABSTRACT

A band pass filter multiplies an input waveform with first trigonometric functions at a plurality of frequencies and then filters the products. Furthermore, with that filtering step, the products are multiplied, or their phase is changed by a predetermined value, and the results are multiplied by the inverse of the trigonometric functions.

The sum of this, for all frequencies, generated a filtered output waveform. Where the input waveform has two components, the corresponding outputs can be obtained from the read and imaginary components of the output waveform. In practice the trigonometric functions are produced by sine and cosine components at each frequency. In this way a band pass filter device is formed which is suitable for use in the control system of an apparatus which must be controlled continuously, such as a control system for a rotor.

26 Claims, 10 Drawing Sheets

FOR $\left(\dfrac{1}{\tau_k S+1}\right.$ = TIME AVERAGING PROCESS, $\left.\dfrac{a_k e^{j\theta_k}}{b_k e^{-j\gamma_k}}\right.$ = CONTROL LAWS$\left.\right)$

FIG. 6

BAND-PASS-FILTER WITH CONTROL LAW

WHERE $\omega = \omega_k, a = a_k, \theta = \theta_k, \tau = \tau_k$

BAND PASS FILTER DEVICE AND A METHOD OF FILTERING USING SUCH A DEVICE

BACKGROUND OF THE INVENTION

1. Field of the Invention

The present invention relates to a band pass filter device. It also relates to a method of filtering using such a device. It is particularly, but not exclusively, concerned with the application of such a filtering device to a control apparatus for rotor vibration.

SUMMARY OF THE INVENTION

In U.S. Pat. No. 4,697,128 a control apparatus for a rotor is disclosed. The rotor is supported by an electromagnetic bearing, and servocircuits detect the deviation of that rotor from a desired position into different directions. The outputs of those servocircuits are fed into respective control circuits, and those control circuits generate output signals which are used to control the servocircuits so as to ensure the rotor is maintained in the desired position. In U.S. Pat. No. 4,697,128, a fixed proportion of the signal to be fed to one servocircuit is also fed to the other circuit, and vice versa, in order to eliminate from the control circuit a differential circuit, by reducing the number of components and improving damping at the resinous point of the rotor.

The inventors of the present invention sought to apply Fourier Transform techniques to the control apparatus for controlling rotor vibration, and it was found that there was a problem. Most Fourier techniques involve arrangements in which a waveform was sampled, and then Fourier techniques were applied to those samples. During the time that calculations for the Fourier transform were being made, the waveform was not sampled. For many applications, this is satisfactory, but for control of a rotor it is unsuitable, in that no sampling occurs during the time that the Fourier calculations are occurring. Clearly, if there was deviation of a rotor during that time, it would go undetected.

Therefore, a technique was necessary to provide more continuous operation, and the present invention seeks to provide a band pass filter device for achieving this.

In the present invention, the waveform is multiplied by a trigonometric function at a plurality of frequencies, filtered, processed, multiplied by the inverse of the trigonometric functions, and summed. In the processing step, the complex components generated are multiplied and/or changed in phase. In this way, a band pass filter device is provided which can operate continuously, and so provide satisfactory results when applied to control a rotor.

It should be noted that when the present invention is applied to control of a rotor, there will then be two components representing the two directions in which the rotor may move, and in that case the band pass filter device of the present invention is modified so that it receives those two components and processes them both.

The trigonometric function may be such that when they are multiplied with the oscillation waveform, sine and cosine functions are generated.

Preferably, the invention involves a filtering stage, arranged to generate a time average of the products of multiplication.

BRIEF DESCRIPTION OF THE DRAWINGS

Embodiments of the present invention will now be described in detail, by way of example, with reference to the accompanying drawings in which.

DETAILED DESCRIPTION

Before describing embodiments of the present invention, a frequency analyser (hereinafter abbreviated to FFT analyser) which uses a Discrete Fourier transform (abbreviated to DFT) operation will be described referring first to FIG. 1.

Figure 1:
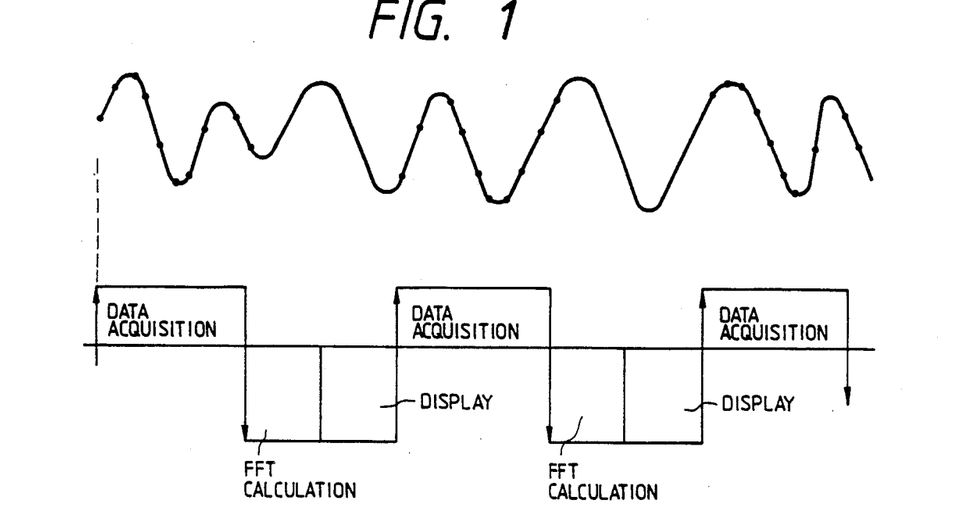
FIG. 1 shows the steps of data acquisition and Fourier calculation in known processing operations.

As shown in FIG. 1, a plurality of waveform values corresponding to those of memories N of a FFT analyzer are read into the memories in a predetermined sampling cycle and stored in the memories of the FFT analyzer. Although the number of memories N is about 1024 for a normal FFT analyzer, FIG. 2 illustrates an example with only 8 memories.

Figure 2:
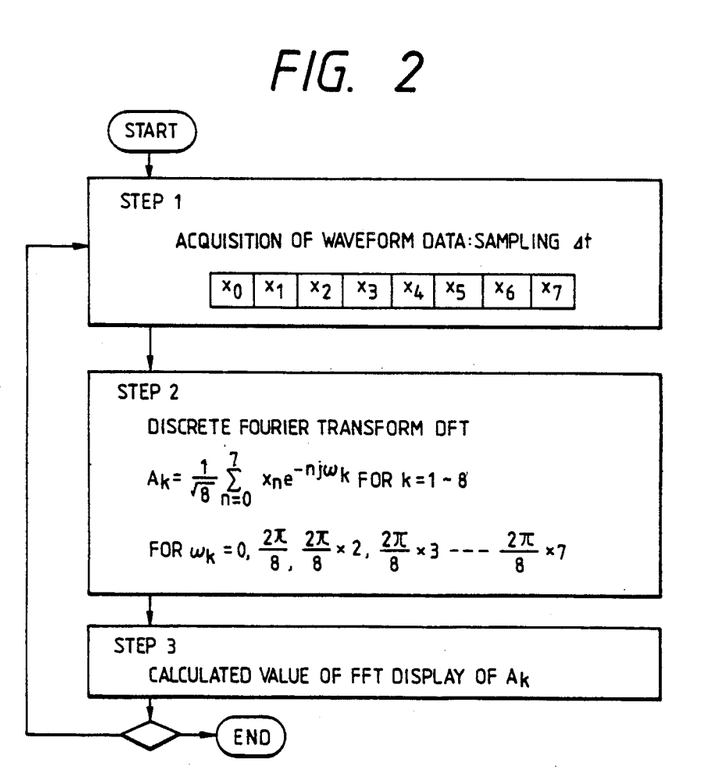
FIG. 2 shows processing to permit continuous Fourier operations.
Figure 3:
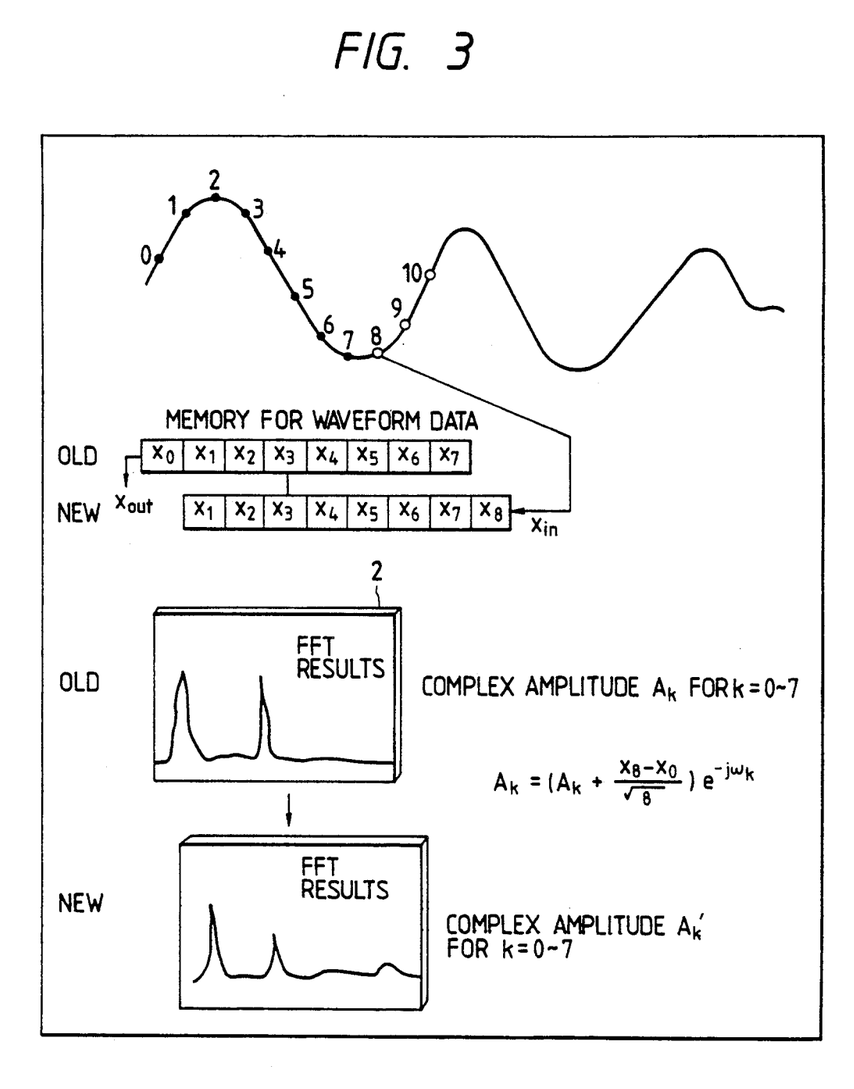
FIG. 3 shows a timing diagram for illustrating continuous Fourier operations.

FIG. 2 shows, in a form of flow chart, the processing sequence outline for the FFT analyzer. Step 1 of the flow chart in FIG. 2 is reading of waveform data. In this example the stored values are $$x_0, x_1, x_2, x_3, x_4, x_5, x_6, x_7 \tag{1}$$

Using these sampling values, the DFT process is executed in step 2. Here, 8 values $$A_0, A_1, A_2, A_3, A_4, A_5, A_6, A_7 \tag{2}$$

are obtained after the DFT. In general, the value $A_k$ is a complex number, and it is evaluated by the following formula:

$$A_k = \frac{1}{\sqrt{8}} \sum_{n=0}^{7} x_n e^{-njw_k} \tag{3}$$

for $k = 0$ to 7 where $j = \sqrt{-1}$ = imaginary unit $$w_k = 0, \frac{2\pi}{8}, \frac{2\pi}{8} x_2, \ldots \frac{2\pi}{8} x_4 \tag{4}$$

The value $A_k$ is the complex amplitude for every frequency $w_k$, and the larger the value of $A_k$, the more predominant the oscillation of that frequency.

Next, the absolute values for the calculated result $A_k$ ($k=0$ to 7) is shown on a display as a bar graph in step 3.

The FFT analyzer is a device that executes a string of operations corresponding to FIG. 2, data reading→DFT procedure→display, at high speed. The timing for a single string process is shown in FIG. 1. Of the original oscillation waveforms, DFT calculation is carried out on the waveform values that have been acquired in a group for every interval investigated. The intake of data is interrupted during DFT calculation and display. Therefore, DFT calculation does not occur for all of the intervals of the input waveforms, making unavoidable the existence of intervals which are not investigated.

It is assumed in the DFT calculation that the acquired data values $x_0$ to $x_7$ are periodic functions that are periodically repeated even outside the intervals investigated. Therefore, it is normal to use input values $x_0$ to $x_7$ multiplied by an aperture function, rather than to use the actual values. Also, an extremely high speed operation called butterfly operation is used as the algorithm for evaluating the complex amplitude Ak, defined in equation (3). Thus, various measures are applied in actual control apparatus for Fourier Transform. An example of one such known apparatus for Fourier Transform is the apparatus mentioned in Japanese Patent Application Laid-Open No. 61-196370(1986).

As mentioned earlier, in a conventional FFT analyzer, there is a gap in data acquisition between the first data acquisition step and the next data acquisition step. Because the main object of this FFT analyzer is to moniter the analyzed results of the oscillation waveforms, such a gap does not present a problem. By monitoring the complex amplitude indicated as the output for each frequency component, and by detecting abnormal oscillations and analyzing the cause thereof, very useful information can be obtained, which is the reason for the widespread use of the FFT analyzer.

If DFT processing is applied to a control apparatus such as a servo controller, such a gap in data acquisition cannot be permitted. A processing form that executes continuous DFT processing for moment by moment data acquisition (input) and moment by moment output, is needed.

In order to eliminate the above gap, DFT processing is executed each time one waveform datum is acquired. Use is also made of a formula for calculating the complex amplitude as listed in the article by Takeshi Ankyoin and Masayuki Nakajima entitled "How to use FFT" in Electronic Science Series 91. Sanpo Publishing. Feb. 15, 1982, pages 132-133).

That formula will now be explained for the case of 8 sampling values.

First, assuming that, for time t, the last 8 waveform data $x_k$ $$x_0, x_1, x_2, x_3, x_4, x_5, x_6, x_7 \tag{5}$$

are stored in a memory, and the complex amplitude $A_k$ for those values is given as $$A_0, A_1, A_2, A_3, A_4, A_5, A_6, A_7 \tag{6}$$

In this state, after $t+\Delta t$, when a new waveform data value $x_8$ is acquired, the content of the waveform data storing memory is renewed as $$x_1, x_2, x_3, x_4, x_5, x_6, x_7, x_8 \tag{7}$$

Therefore a way must be found to obtain the corresponding new complex amplitude $A_k'$ as $$A_0', A_1', A_2', A_3', A_4', A_5', A_6', A_7' \tag{8}$$

The complex amplitude $A_k$ corresponding to the data values of expression (5) is $$A_k = \frac{1}{\sqrt{8}} x_0 e^{0jw_k} + x_1 e^{-1jw_k} + x_2 e^{-2jw_k} + \ldots + \tag{9}$$

$$x_6 e^{-6jw_k} + x_7 e^{-7jw_k}$$

for $k = 0-7$ by following the definition for formula (3). Similarly, the new complex amplitude $A_k'$ corresponding to the waveform data values in expression (7) is represented by the following equation:

$$A_k = \frac{1}{\sqrt{8}} x_1 e^{0jw_k} + x_2 e^{-1jw_k} + x_3 e^{-2jw_k} + \ldots + \tag{10}$$

$$x_7 e^{-6jw_k} + x_8 7 e^{-7jw_k}$$

for $k = 0-7$

By comparing formulae (9) and (10), the following equation is obtained.

$$A_k' = e^{+1jw_k} A_k + \frac{x_8 - x_0}{\sqrt{8}} \tag{11}$$

for $k = 0-7$

Figure 4:
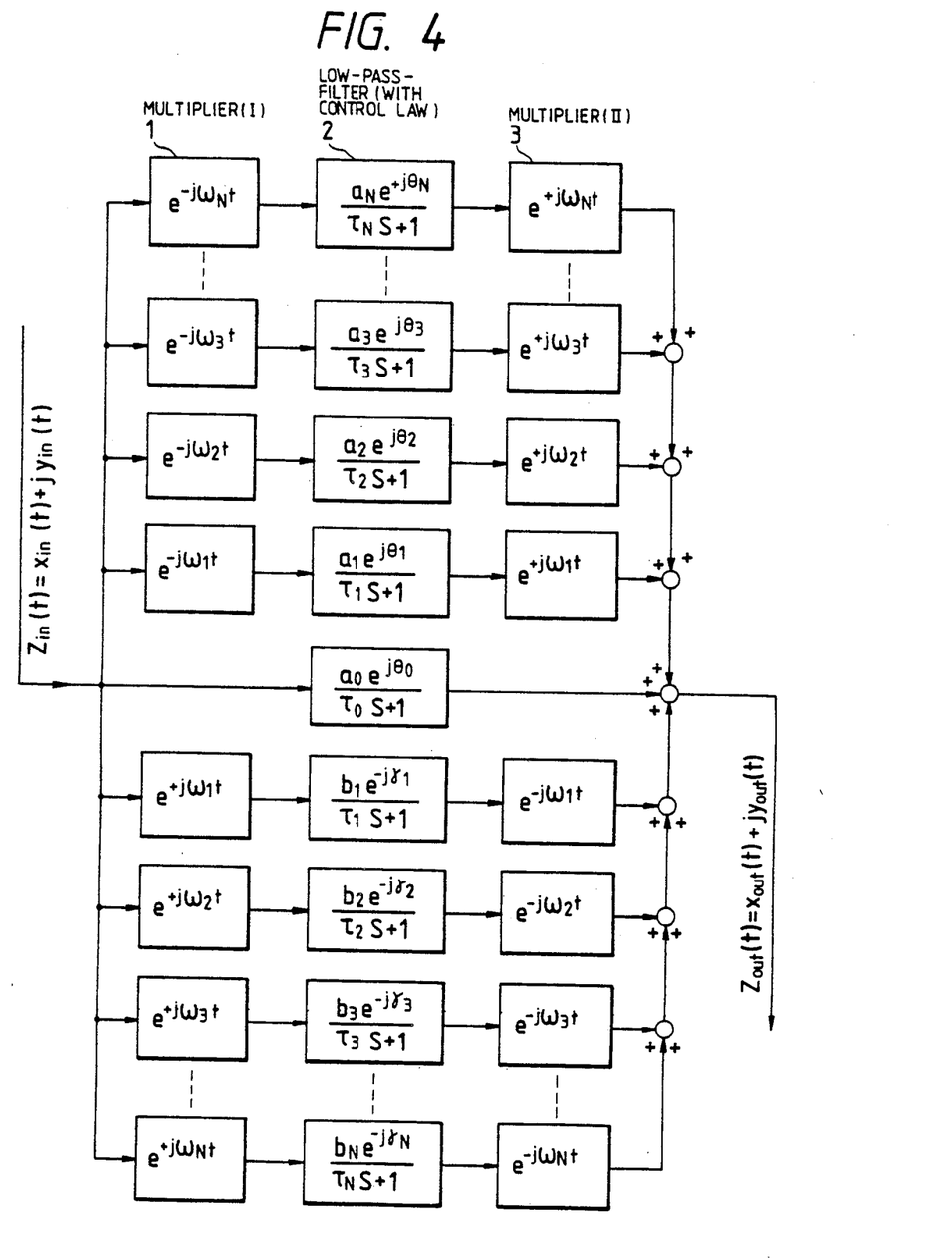
FIG. 4 shows a block diagram of the first embodiment of the present invention.

The signification of the above equation is shown by FIG. 4. The waveform values are read moment by moment and for each sampling time, and those values are stored in the memory, written as $x_{in}$ ($=x_8$). In that case the oldest datum in the memory must be discarded. This is written as $x_{out}$ ($x=x_0$).

If the number of sampling waveform data is written as N, then the complex amplitude $A_k$ can be renewed by the formula below:

$$\left( A_k + \frac{X_{in} - X_{out}}{\sqrt{N}} \right) e^{+jw_k} \rightarrow A_k \tag{12}$$

for $k = 0 - (N - 1)$

Thus the moment by moment complex amplitude is obtained from continuously inputted sampling waveform data, without any gap in data acquisition. This is the processing principle for a consecutive DFT.

A first embodiment of the present invention will now be explained, with reference to FIG. 6.

Consider input of an original oscillation waveform in 2 channels, $x_{in}(t)$ and $y_{in}(t)$. Input of a single input is considered as a variation of the above, complex oscillation waveform $z_{in}(t)$ of the 2 channels is $$Z_{in}(t) = x_{in}(t) + jy_{in}(t) \tag{13}$$

for $j = \sqrt{-1}$ = imaginary unit

According to Fourier Transform, this oscillation waveform can be approximated by the sum of each frequency component $$Z_{in}(t) = A_o + \sum_{k=1}^{N} (A_k e^{jw_k t} + B_k e^{-jw_k t}) \tag{14}$$

The component $e^{jw_k t}$ is called a forward component and the component $e^{-jw_k t}$ is called a backward component. In order to extract a certain oscillation waveform component $w_k$, respective trigonometric function values, $e^{-jw_k t}$ for a forward amplitude $A_k$, and $e^{+jw_k t}$ for a backward amplitude $B_k$, are multiplied with the original wave number.

$$Z_{in}(t)e^{-jw_k t} = A_o e^{-jw_k t} + A_1 e^{j(w_1 - w_k)t} + \ldots + A_k + A_k_1 e^{j(w_{k+1} - w_k)t} B_j e^{-j(w_1 - w_k)t} + \ldots + B_k e^{-2jw_k t} + \ldots \tag{15}$$

$$Z_{in}(t)e^{+jw_k t} = A_o e^{jw_k t} + A_1 e^{j(w_1 + w_k)t} + A_k e^{2jw_k t} + \ldots + B_1 e^{-j(w_1 - w_k)t} + \ldots + B_k + B_{k+1} e^{-j(w_{k+1} - 2k)t} + \ldots \tag{16}$$

The time average for equations 15 provides the amplitude $A_k$. Also by taking the time average for equation 16, $B_k$ is obtained. Also by taking the time average of the original oscillation waveform without multiplying, $A_o$ is obtained. By writing the time average operation as ‾, such are expressed as follows, $$\overline{Z_{in}(t)} = A_O$$

$$\overline{Z_{in}(t)e^{-jw_k t}} = A_K$$

$$\overline{Z_{in}(t)e^{jw_k t}} = B_k \tag{17}$$

Thus, when the original complex oscillation waveform $A_{in}(t)$ is input and the operation is executed by taking the time average by multiplying the trigonometric function $e^{+jw_k t}$, for all frequency components $w_k(k=1-N)$ the forward component and the backward component for each frequency complex oscillation amplitude are obtained. Thus, a band pass filter for extracting $A_o$, $A_k$, $B_k$, $(k=1-N)$ is formed.

The desired output signals are prepared by multiplying the thus obtained complex oscillation amplitude, by control laws.

Control laws are generally indicated by a transfer function that shows the relationship between the input and output of the controller. The amount magnification and/or phase lead or lag corresponding to each complex oscillation amplitude components of the input signal are determined for the respective frequencies. Now assume the amplitude of the forward oscillation frequency component $w_k$ is multiplied by $a_k$, and the phase thereof is advanced by $\theta_k$. Similarly, assume the amplitude of the backward oscillation frequency component $w_k$ is multiplied by $b_k$, and the phase thereof is advanced by $\gamma_k$. The forward complex oscillation amplitude $C_k$ and the backward complex oscillation amplitude $D_k$, of the obtained output signal are defined in the following form.

$$A_o a_o e^{j\theta_o} \rightarrow C_o$$

$$A_k a_k e^{j\theta_k} \rightarrow C_k$$

$$B_k b_k e^{j\gamma_k} \rightarrow D_k \tag{18}$$

Thus the obtained output signal $Z_{out}$ of the control apparatus becomes, by transferring these forward and backward complex oscillation amplitude components to the time domain.

$$Z_{out}(t) = A_o a_o e^{j\theta_o} \sum_{k=1}^{N} (A_k a_k e^{j\theta_k} e^{-jw_k t} + B_k b_k e^{-j\gamma_k} e^{-jw_k t}) = \tag{19}$$

$$C_o + \sum_{k=1}^{N} (C_k e^{jw_k t} + D_k e^{-jw_k t})$$

Figure 5:
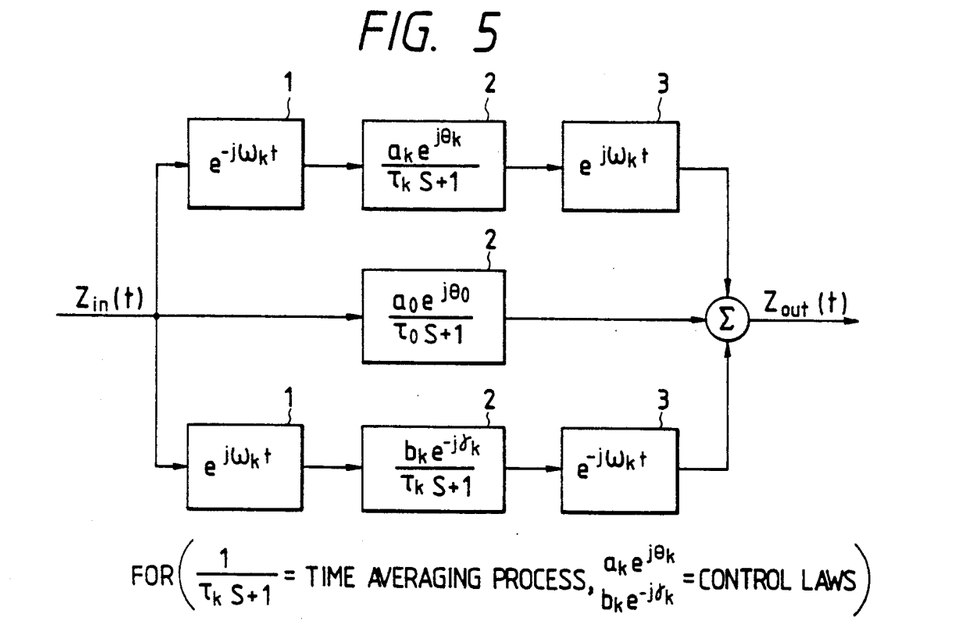
FIG. 5 shows a modified diagram, corresponding to FIG. 1 but at a single frequency.

The process of producting output signals from such input signals with respect to one oscillation frequency component $w_k$, is shown in FIG. 5. The input signal $Z_{in}(t)$ is multiplied by the respective trigonometric functions $e^{\pm jw_k}$ for forward and backward components, the time averages are obtained, and the complex oscillation amplitude of that component is obtained. This corresponds to a variation in a band pass filter. Next, the resultant complex oscillation amplitude is multiplied by the control law $a_k e^{j\theta_k}$ or $b_k e^{-jw_k}$ and the complex oscillation amplitude component of the output signal is executed for every frequency $w_k$. By multiplying that by $e^{\pm jw_k}$, the waveform of the output signal in the time domain is constructed. The essential part of this operation is summarized with respect to one oscillation frequency component $w_k$ in FIG. 5.

First, the process for the time averaging will be described, as shown in FIG. 5. The process for the time averaging is achieved by a first order low pass filter with a large constant value of the time lag. For example, $$\frac{1}{\tau s + 1} \tag{20}$$

for $\tau$ = time lag constant,

A large time lag constant is desirable, but normally, approximately half the different of two adjacent frequencies $w_k - w_{k+1}$ is selected, $$\frac{1}{2\pi\tau} \approx \frac{|w_k - w_{k+1}|}{2} \tag{21}$$

If this shows the Bode diagram configuration corresponding to expression 8, the lag does not have to limit only first order, so means of secondary lag and tertiary lag filtering element are available, In a digital processing system, this process for the time averaging will be modified as follows. For the sampling time $\Delta t$, expression 8 is rewritten into a discrete system, and the output $V_{out}$ corresponding to the input $V_{in}$ for time t is found in the form:

$$V_{out}(t) = \frac{2^M V_{out}(t - \Delta t) + V_{in}(t)}{1 + 2^M} \tag{22}$$

for $2^M = \frac{\tau}{\Delta t}$

There are various other methods which may be used for time averaging. However, the overall transfer function of FIG. 5, wherein $e^{\pm jwk^t}$ is multiplied in the first half, the time average is determined for expression 20 $a_k e^{j\theta}k$ and $b_k e^{-j\gamma}k$ is multiplied as the control laws, and then the waveforms are reconstructed with $e^{\pm jwk^t}$, is expressed as:

$$\frac{a_k e^{j\theta}k}{\tau_k(s - jw_k) + 1} \tag{23}$$

$$\frac{b_k e^{-j\gamma}k}{\tau_k(s + jw_k)} \tag{24}$$

In other words, this becomes a band pass filter at $w = \pm w_k$.

Figure 6:
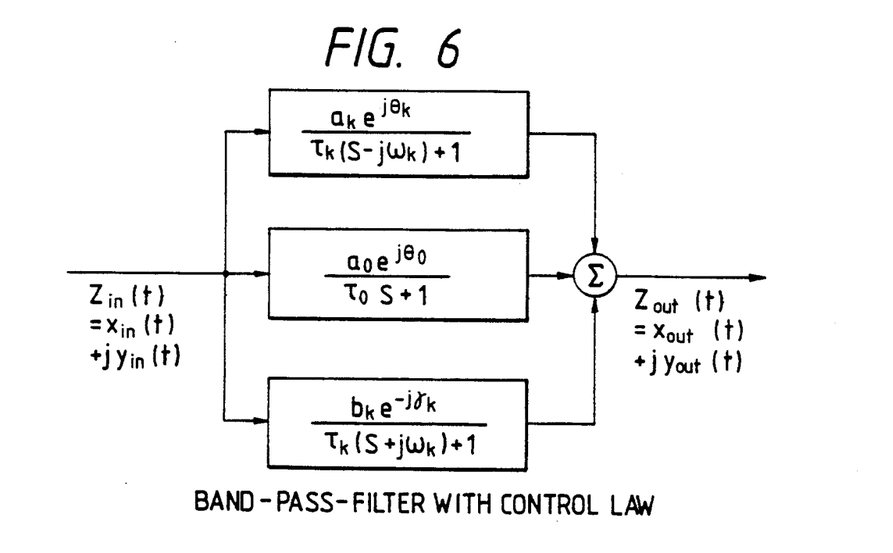
FIG. 6 illustrates a complex number transfer function.

In other words, this is considered a band pass filter having a coefficient in the form of the control law, which is illustrated in FIG. 6.

In FIG. 5 and FIG. 6 the method for reconstructing the waveform is by providing the control law to the band pass filter which extracts respectively forward and backward oscillation components for a certain frequency $w_k$. This frequency $w_k$ is divided from the smaller part $w_1$ to the larger part $w_N$, and the filter device according to the present invention arranges these in parallel, which is shown in FIG. 4.

Both the forward oscillation frequency and the backward oscillation frequency have the same frequency resolution, arranging up to $w_k$ ($k=1-N$). It is not necessary to take the same number of frequency resolutions, so the total frequency resolution of the forward and the backward oscillation frequencies may differ from each other. Also, the frequencies of the $e^{jwf^t}$ of the forward and the $e^{-jwb^t}$ of the backward coincide for $w_f = w_b w2_k$, but the frequency resolutions for forward and backward may also differ. In other words, as shown, the forward and backward components are forward: $w_{f1}, w_{f2}, \ldots w_{fN}$ backward: $-w_{b1}, -w_{b2} \ldots w_{bN}$.

Also the frequency resolution may differ for forward and backward component as for the total number of N.

Now, in the construction of FIG. 4, from the right hand side a complex oscillation (for the 2 channels one may be an X-direction displacement and the other Y-direction displacement ) $Z_{in}$ is inputted, and at a multiplier 1, $e^{-jwk^t}$ and $e^{jwk^t}$ are first applied in order to extract the forward and the backward oscillation components. Due to the multiplier (1), the complex amplitude of the frequency component that is immediately needed, corresponds to a direct current, so the operation occurs on through the low pass filter. At the same time, each oscillation frequency component is multiplied by the control laws $a_k e^{j\theta}k$ and $b_k e^{j\gamma}k$ ($k=1-N$), in the forward and backward direction. This process corresponds to a low pass filter (with control law) of the FIG. 4.

A second multiplier 2 of the next step, to restore the extracted original oscillation waveform of the oscillation frequency component. To do this their forward and backward components are respectively multiplied by $e^{jwk^t}$ and $e^{-jwk^t}$. Thus the oscillation waveform for control is reproduced for every oscillation frequency component and by summing these waveforms, the output signal $Z_{out}$ is obtained. The centre line shows the construction of an output waveform for frequency =0. This represents the behaviour of the mean value corresponding to the input waveform. Such a process may be also adapted as required.

Because this output signal $Z_{out}$ has two channels, in channel X and channel Y, they may be used for the purpose of control. This corresponds to a band pass parallel type controller and an application of fuel a controller will be described later.

Figure 7:
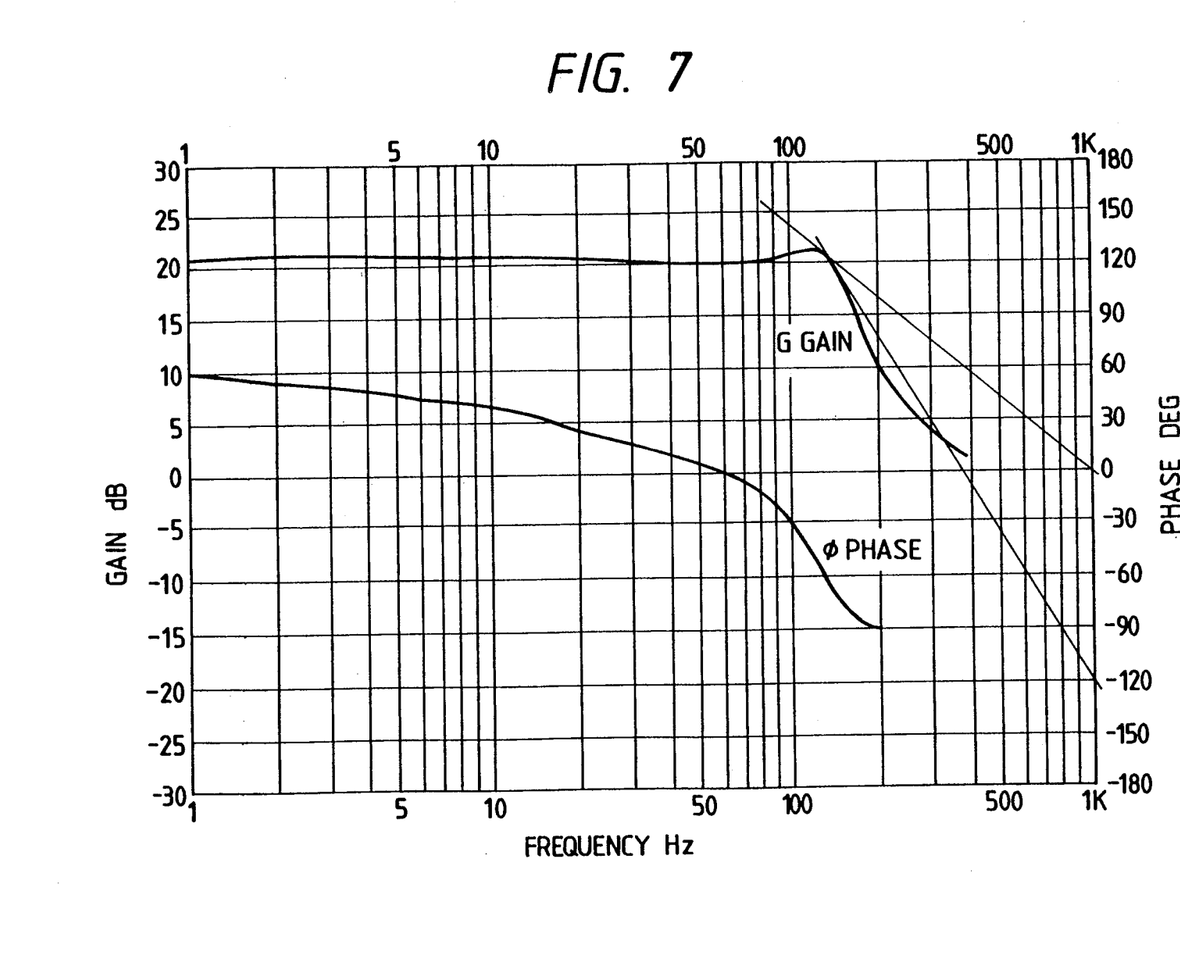
FIGS. 7 and 8 show Bode diagrams illustrating transfer functions of a control apparatus incorporating the present invention.
Figure 8:
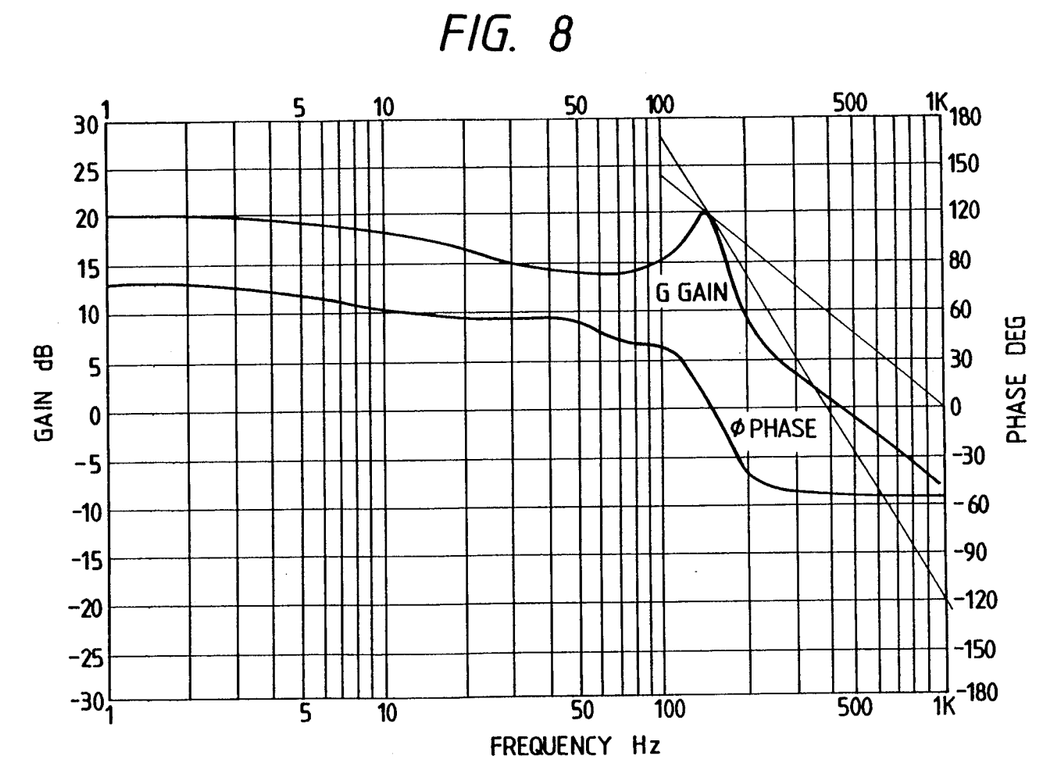

In FIG. 7 and FIG. 8, an example of this control method constructed by this process, is shown as a transfer function from $Z_{in}$ to $Z_{out}$.

The transfer function in FIG. 7 is for $$G(s) = \sum_{k=0}^{127} \frac{1}{\tau(s - jw_k) + 1} \tag{25}$$

for
$w_k = 0, 1, 2, \ldots 127$ Hz
$\tau = \frac{1}{2}\pi \times 0.5$ Hz $= 1/\pi$ sec
$a_k e^{j\theta}k = 1.0$
$b_k e^{j\gamma k} = 0.0$.

This is a characteristic where the band pass filters are arranged simply. In a domain larger than 127 Hz, the gain rapidly decreases, obtaining a form not found in past servo controllers. At about 60 Hz the phase crosses the zero point, shifting from lead to lag, which corresponds to an instable state A result of obtaining a wider phase leading domain, is shown in FIG. 8, and the transfer function is $$G(2) = \sum_{k=0}^{127} \frac{e^{j\frac{\pi}{2Nk}}}{\tau(s - jw_k) + 1} \tag{26}$$

for $w_k = 0, 1, 2, \ldots 127$ Hz
$= \frac{1}{2}\pi \times 0.5 = 1/\pi$ sec $b_k e^{-j\gamma k} = 0.0 \qquad a_k e^{j\theta}k = e^{j\frac{\pi}{2Nk}}$ $N = 64$ Here, a small downward bend and is seen in the gain curve, but the domain of the phase lead is expanded up to nearly 127 Hz, which is the limit for the gain curve.

By taking measures for the control law, the desired input/output transfer function which meets the purpose for control, may be obtained. By determining the control laws $a_k e^{j\theta}k$ and $b_k e^{-j\gamma k}$ accurately, with a constant gain of transfer function and a rapid gain decrease occurrance above the limit frequency, the one having a sufficient phase lead is obtained. These are desired characteristics for various servo controls, such as a location control for a flexible mechanism system, and a magnetic levitation control such as an electromagnetic bearing of an elastic rotor.

Figure 9:
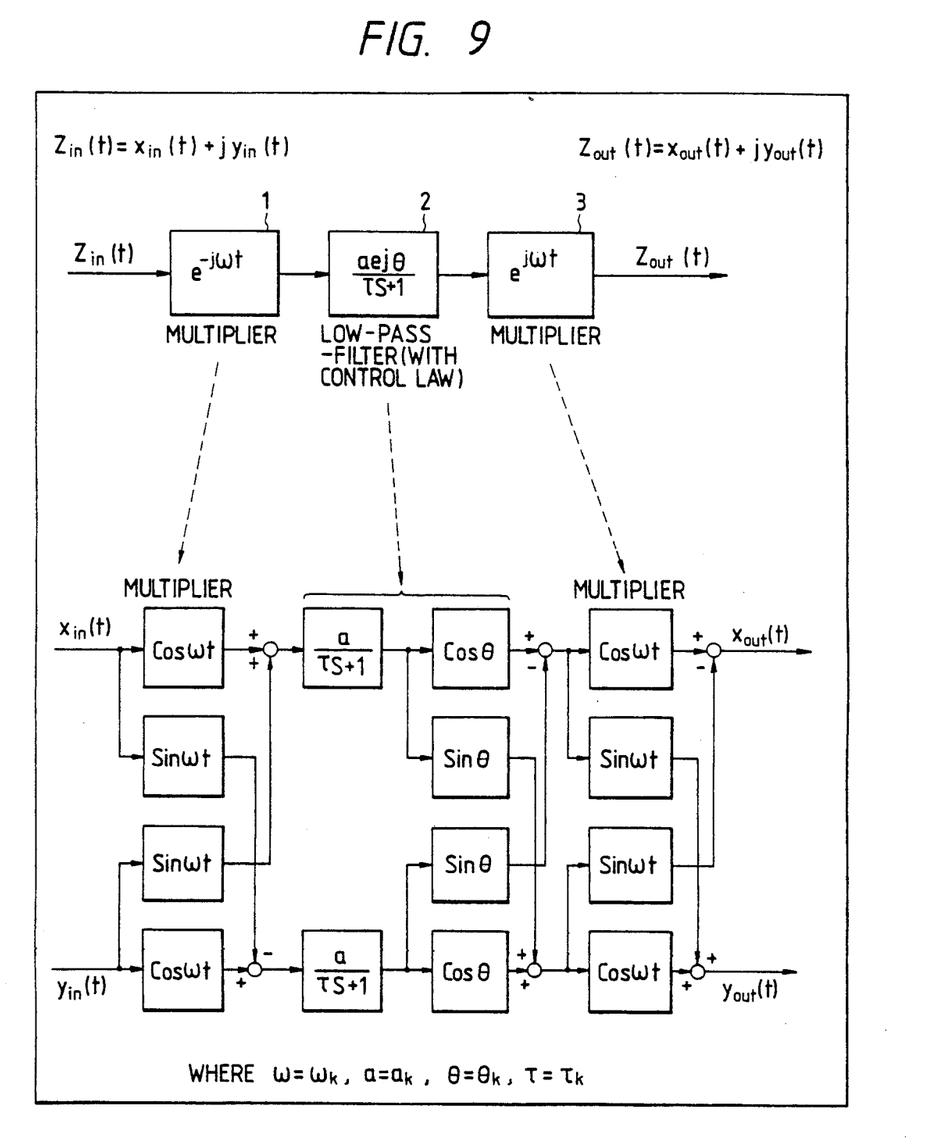
FIG. 9 illustrates forward oscillation processing.
Figure 10:
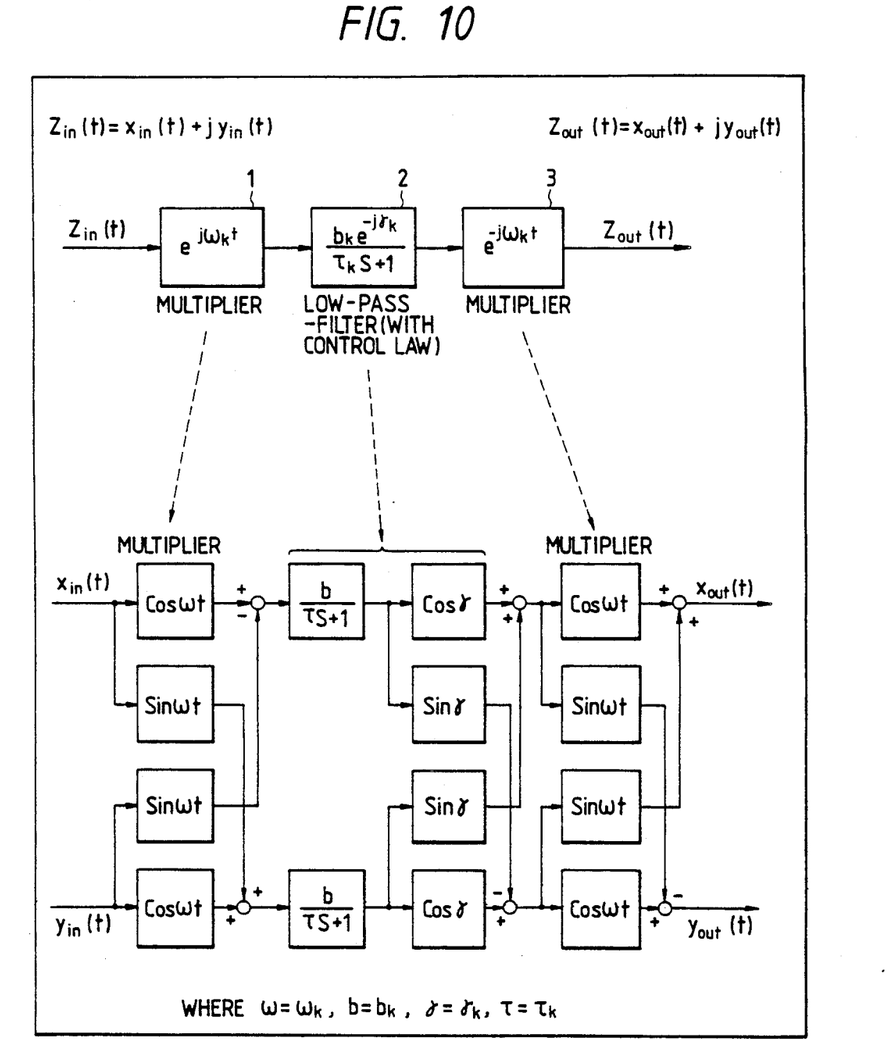
FIG. 10 illustrates backward oscillation processing.
Figure 11:
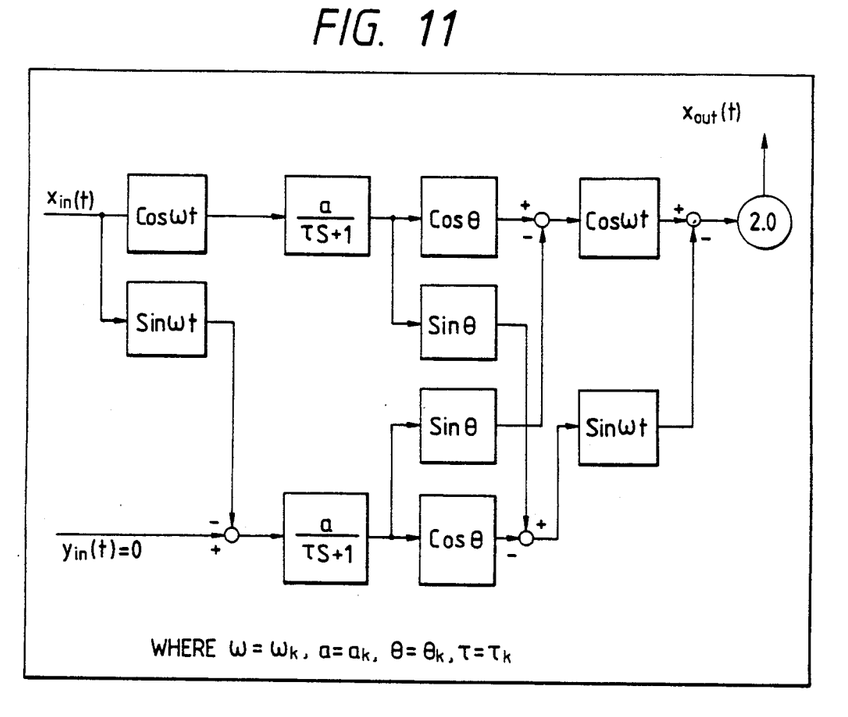
FIG. 11 is a further embodiment of the present invention, having a single input channel.

In the above explanation, the complex waveform processing simultaneously the 2 channels of X and Y was referred to. The processing of oscillation components in actual circuits is shown in FIG. 9 for the forward components and in FIG. 10 for the backward components. The operation for multiplying $e^{\pm jwk^t}$ is equivalent to multiplying $\cos w_k t$ and $\sin w_k t$ each time. Also, the actual process for first order processing, with an input of only one channel, channel X is shown in FIG. 11. If this structure is provided in parallel for each frequency component, this becomes a controller for a first order channel X.

Figure 12:
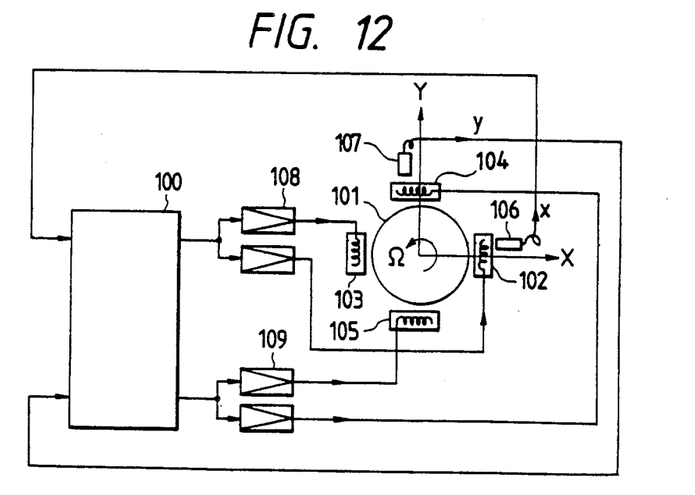
FIG. 12 shows the application of the present invention to control apparatus for a rotor.

The application of the present invention to rotor control will now be described with reference to FIG.

12. In FIG. 12, the control circuit 100 embodying the present invention is used to control a rotor 101.

Adjacent the rotor 101 are a pair of X-direction electromagnetic coils, 102, 103 which control the X-direction position of the rotor in a manner that will be described, a pair of Y-direction coils 104, 105 which control the Y-direction movement of the rotor 103, and X-direction and Y-direction displacement sensors 106, 107. Consider now a displacement of the rotor 101 in the X-direction. This is detected by the X-direction detector 106, which may be a non-contacting sensor of the induction coil type, capacitance type, optical type, etc, and the detector 106 transmits a signal to the control circuit 100. The control circuit 100 generates an output which is fed via amplifier 108 to the X-direction coils, 102, 103. Depending on the detected movement of the rotor 101 by the detector 106, the coils 102, 103 are controlled to restore the rotor 101 to its desired position in the X-direction. In a similar way, displacement of the rotor 101 in the Y-direction is detected by the detector 107, which supplies a signal to the control circuit 100, the outputs of which pass via amplifiers 109 to the Y-direction coils 104, 105 so as to control the rotor 101 to its desired position in the Y-direction. Thus, the rotor may be maintained in its desired position.

In the arrangement shown in FIG. 12, the rotor 101 is supported by an electromagnetic bearing. Apart from the fact that the control system 100 is according to the present invention, the general arrangement of the rotor control shown in FIG. 12 is similar to the control system disclosed in U.S. Pat. No. 4,697,128.

Figure 15:
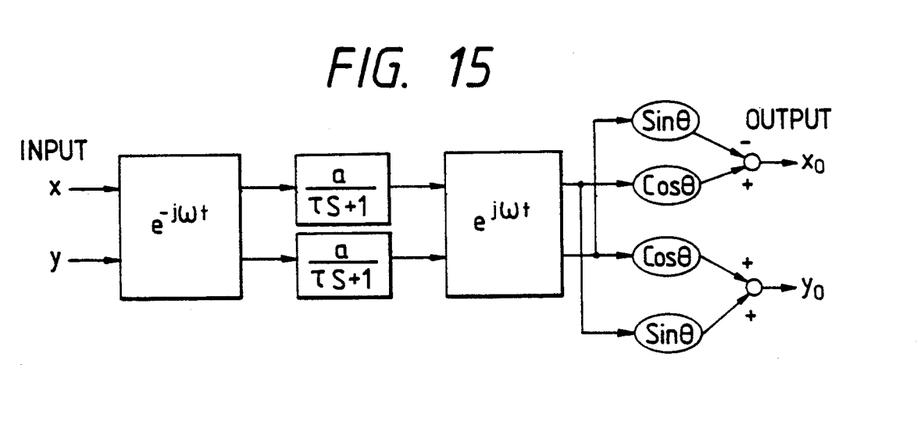

As was stated above, the control circuit 100 shown in FIG. 12 is designed according to the principle of the present invention, but a number of alternative arrangements are possible, and these will now be described with reference to FIGS. 13 and 15.

Figure 13:
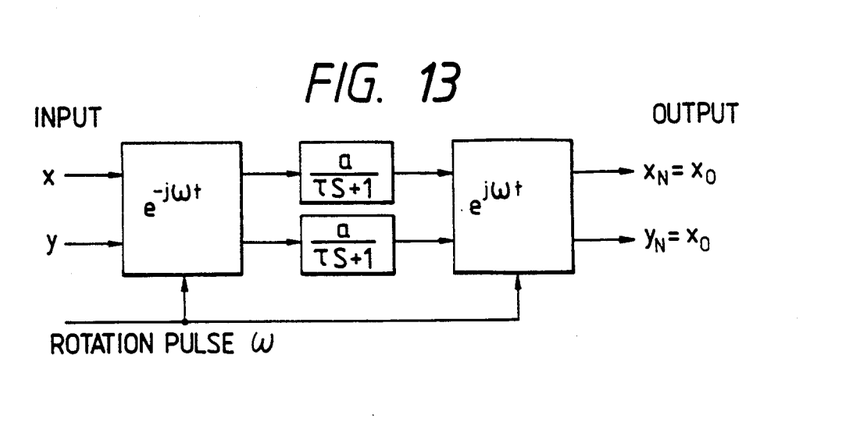
FIGS. 13 to 15 show alternative control circuits for use with the rotor control apparatus of FIG. 12.

FIG. 13 shows the simplest arrangement, which the X-direction and Y-direction signals from the detectors 106, 107 are fed to respective circuits similar to FIG. 9, to generate corresponding signals for the coils. It can be seen that the "w" component of the trigonometric function is derived from a rotation pulse signal from the rotor 101.

Assume, which is acceptable in the case of a rotor, that the time constant of any movement is large. In this case, the transfer function can be expressed as follows, considering the constant to be complex:

$$G(s) = \frac{ae^{j\theta}}{\tau(S - jw) + 1} \quad (29)$$

This corresponds to a band pass filter which w is the central frequency. When this central frequency corresponds to the frequency of a revolution of the rotor, the control circuit can thus act as a tracking filter.

Suppose, first of all, the $\theta$ is zero, then the numerator of equation 29 becomes a real number, and equation 29 is modified to the following:

$$G(s) = \frac{a}{\tau(S - jw) + 1} \quad (30)$$

This corresponds to the circuit shown in FIG. 13, in which X-direction and Y-direction signals to the coils are produced direction from the corresponding X-direction and Y-direction signals from the detectors, and is related to the control system described in U.S. Pat. No. 4,128,795, but embodying the present invention.

Figure 14:
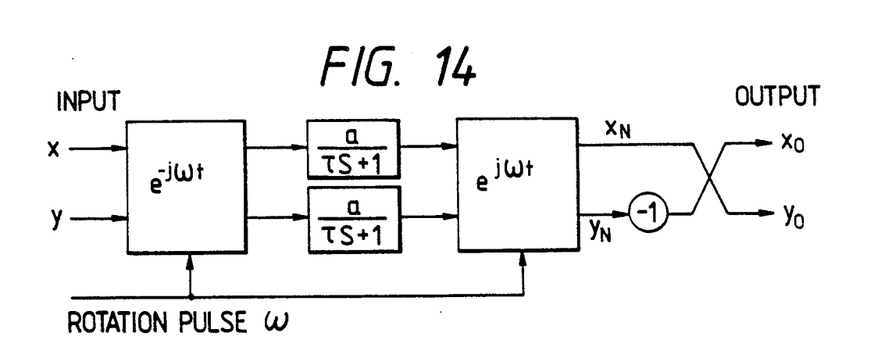

If, on the other hand $\theta$ is $\tau/2$, the transfer function of equation 29 becomes:

$$G(s) = \frac{ja}{\tau(s - jw) + 1} \quad (31)$$

In this case, the effect of the control circuit 100 is as shown in FIG. 14, in which there is "crossking" of the x and y signals, so that the output to the X-direction coils is derived from the Y input, and vice versa. This crossing gives a different type of control function, the mathematical purpose of which is described in U.S. Pat. No. 4,697,128.

Finally, however, the centre frequency of the band pass filter can be made to agree with the self-excited vibration frequency of the rotor, the control circuit 101 can operate as a tuning filter, and the outputs thereof effectively mix the X-direction and Y-direction signal, in a way that is described in U.S. Pat. No. 4,841,212.

However, the control system can then go further than that, in that the proportion of "crossing" signals may then be varied, to permit the control achieved to be adjusted as desired.

Thus, equation 29 above corresponds to a distribution of the output of a filter in the X and Y directions both directly and crossing, so that the output of the filter can be applied either in a parallel or crossing way. In particular, the control system of FIG. 15 is particularly effective for controlling a rotor, and the arrangement of FIG. 15 shows how this crossing effect can be achieved using one band pass filter.

Lastly, the essential significance of the present invention will be discussed. In know controllers, there was a constant relation between the gain and the phase, as seen in a Bode diagram which represents the input/output transfer function. In order to ensure phase lead, an increase as the gain on the right hand side of the diagram was unavoidable, and in order to reduce the gain on the right hand side phase lag is unavoidable. For a servo control system, a Bode diagram with the gain dropping to the right and the leading of the phase was preferred, but this was impossible to achieve. The reason for this was because, when a first order lag is taken as a transfer function, the coefficient for A and B for $$G(s) = \frac{B}{\tau s + A} \quad (32)$$

is real.

However, according to the present invention, A and B can be realized as imaginary coefficients, and the form $$G(s) = \frac{B_r + jB_j}{\tau s + A_r + jA_j} \quad (33)$$

is possible. When $jA_j$ is assigned as $jw_k$, it is a band pass filter with the central frequency as $A_j = w_k$, and is realized by a process of moment by moment multiplying of $e^{\pm jw}k^t$. Also, $j^B{}_j$ signifies the cross coupling of channel X and channel Y, which is a fully feasible circuit in the layout concept for 2 channels.

Thus, the present invention permits the inclusion of even the complex values into design constant as the coefficient of the transfer function of the controller.

The present invention utilizes complex coefficients as the transfer function of the controller. For that purpose, the multiplication of the trigonometric functions coswt and sinwt in the form of $e^{jwt}$, and the original input waveform, is frequently used. Therefore the present invention is suitable for a digital controller. In order to achieve the present invention in an analog controller, it is necessary for filters to be provided in parallel for every oscillation frequency component. The arrangement of e.g. 128 such filters will be extremely costly, but in a digital controller, which tackles this by a software program, such disadvantages are eliminated.

By appropriately changing and adjusting the control laws $a_k e^{j\theta} k$ and $b_k e^{-jw} k$, the present invention is applicable as a general use programmable controller for various types of servo control.

What is claimed is:

1. A band pass filter device for producing an oscillation waveform, comprising:
    means for generating first trigonometric functions at a plurality of predetermined frequencies;
    means for multiplying said oscillation waveform with said first trigonometric functions at said plurality of predetermined frequencies to generate a plurality of products;
    means for filtering said plurality of products, to generate oscillatory complex amplitude components thereof for each of said predetermined frequencies;
    means for multiplying each of said oscillatory complex amplitude components by a corresponding predetermined value, to obtain new oscillatory complex amplitude components;
    means for multiplying said new oscillatory complex amplitude components for each of said predetermined frequencies with a second trigonometric function at the corresponding one of said predetermined frequencies to generate a plurality of resultant values, each of said second trigonometric functions being the inverse of a corresponding one of said first trigonometric functions, with the corresponding first and second trigonometric functions being at the same frequency; and
    means for summing said resultant values and generating an output signal.

2. A device according to claim 1 wherein said oscillatory complex amplitude components are forward oscillatory components.

3. A device according to claim 1 wherein said oscillatory complex amplitude components are backward oscillatory components.

4. A device according to claim 1 wherein said oscillatory complex amplitude components are formed and backward oscillatory components.

5. A band pass filter device according to claim 1 wherein said means for filtering is arranged to generate a time average of said plurality of products, thereby to generate said oscillatory complex amplitude components.

6. A band pass filter device for processing on oscillation waveform, comprising:
    means for generating first trigonometric functions at a plurality of predetermined frequencies;
    means for multiplying said oscillation waveform with said first trigonometric functions at said plurality of frequencies to generate a plurality of products;
    means for filtering said plurality of products to generate oscillatory complex amplitude components thereof for each of said predeterined frequencies;
    means for varying the phase of each of said complex components by a corresponding predetermined value, to obtain new oscillatory complex amplitude components;
    means for multiplying said new oscillatory complex amplitude components for each of said predetermined frequencies with a second trigonometric function at the corresponding one of said predetermined frequencies to generate a plurality of resultant values, each of said second trigonometric functions being the inverse of a corresponding one of said trigonometric functions, with the corresponding first and second trigonometric functions being at the same frequency; and p1 means for summing said resultant values and for generating an output signal.

7. A band pass filter device for processing an input comprising a pair of oscillation waveforms on respective first and second input channels, comprising:
    means for generating first trigonometric functions at a plurality of predetermined frequencies;
    means for multiplying each of said said oscillation waveforms with said first trigonometric functions at said plurality of predetermined frequencies to generate a plurality of products;
    means for filtering said plurality of products, to generate oscillatory complex amplitude components thereof for each of said predetermined frequencies;
    means for multiplying each of said oscillatory complex amplitude components by a corresponding predetermined value, to obtain new oscillatory complex amplitude components;
    means for multiplying said new oscillatory complex amplitude components for each of said predetermined frequencies with a second trigonometric function at the corresponding one of said predetermined frequencies to generate a plurality of resultant values, each of said second trigonometric functions being the inverse of a corresponding one of said first trigonometric functions, with the corresponding first and second trigonometric functions being at the same frequency; and
    means for summing said resultant values, generating an output signal having real and imaginary parts, and outputting said real and imaginary parts as signals respectively on first and second output channels, which first and second output channels correspond respectively to said first and second input channels.

8. A band pass filter device according to claim 7, having means for applying a first proportion of the signal on said first channel and applying a second proportion of the signal on said second channel is also applied to said first channel.

9. A band pass filter device for processing an input comprising a pair of oscillation waveforms on respective first and second input channels, comprising:
    means for generating first trigonometric functions at a plurality of predetermined frequencies;
    means for multiplying each of said said oscillation waveforms with said first trigonometric functions at said plurality of predetermined frequencies to generate a plurality of products;
    means for filtering said plurality of products, to generate oscillatory complex amplitude components thereof for each of said predetermined frequencies;
    means for varying the phase of each of said oscillatory complex amplitude components by a corresponding predetermined value, to obtain new oscillatory complex amplitude components;

means for multiplying said new oscillatory complex amplitude components for each of said predetermined frequencies with a second trigonometric function at the corresponding one of said predetermined frequencies to generate a plurality of resultant values, each of said second trigonometric functions being the inverse of a corresponding one of said first trigonometric functions, with the corresponding first and second trigonometric functions being at the same frequency; and means for summing said resultant values, generating an output signal having real and imaginary parts, and outputting said real and imaginary parts to signals respectively on first and second output channels, which first and second output channels correspond respectively to said first and second input channels.

10. A band pass filter device according to claim 9, having means for applying a first proportion of the signal on said first channel and applying a second proportion of the signal on said second channel is also applied to said first channel.

11. A band pass filter device for processing an oscillation waveform, comprising:

means for generating first sine and cosine functions of said oscillation waveform at a plurality of predetermined frequencies;

means for filtering said first sine and cosine functions, to generate oscillatory components thereof for each of said predetermined frequencies;

means for multiplying each of said oscillatory components by a corresponding predetermined value, to obtain new oscillatory components;

means for multiplying said new oscillatory components for each of said predetermined frequencies with second sine and cosine functions at the corresponding one of said predetermined frequencies to generate a plurality of resultant values, each of said second sine and cosine functions corresponding to one of said first sine and cosine functions, with the corresponding first and second sine and cosine functions being at the same frequency; and means for summing said resultant values and generating an output signal.

12. A band pass filter device for processing on oscillation waveform, comprising:

means for generating first sine and cosine functions of said oscillation waveform at a plurality of predetermined frequencies;

means for filtering said first sine and cosine functions to generate oscillatory components thereof for each of said predetermined frequencies;

means for varying the phase of each of said oscillatory components by a corresponding predetermined value, to obtain oscillatory components;

means for multiplying said new oscillatory components for each of said predetermined frequencies with second sine and cosine functions at the corresponding one of said predetermined frequencies to generate a plurality of resultant values, each of said second sine and cosine functions corresponding to one of said first sine and cosine functions with the corresponding first and second sine and cosine functions being at the same frequency; and means for summing said resultant values and for generating an output signal.

13. A method of filtering an oscillation waveform, comprising:

generating first trigonometric functions at a plurality of predetermined frequencies;

multiplying said oscillation waveform with said first trigonometric functions at said plurality of predetermined frequencies to generate a plurality of products;

filtering said plurality of products, to generate oscillatory complex amplitude components thereof for each of said predeterined frequencies;

multiplying each of said oscillatory complex amplitude components by a corresponding predetermined value, to obtain new oscillatory complex amplitude components;

multiplying said new oscillatory complex amplitude components for each of said predetermined frequencies with a second trigonometric function at the corresponding one of said predetermined frequencies to generate a plurality of resultant values, each of said second trigonometric functions being the inverse of a corresponding one of said first trigonometric functions, with the corresponding first and second trigonometric functions being at the same frequency; and summing said resultant values and generating an output signal.

14. A method according to claim 13 wherein said filtering generates a time average of said plurality of products, thereby to generate said oscillatory complex amplitude components.

15. A method of filtering an oscillation waveform, comprising:

generating first trigonometric functions at a plurality of predetermined frequencies;

multiplying said oscillation waveform with said first trigonometric functions at said plurality of frequencies to generate a plurality of products;

filtering said plurality of products to generate oscillatory complex amplitude components thereof for each of said predetermined frequencies;

varying the phase of each of said oscillatory complex amplitude components by a corresponding predetermined value, to obtain new oscillatory complex amplitude components;

multiplying said new oscillatory complex amplitude components for each of said predetermined frequencies with a second trigonometric function at the corresponding one of said predeterined frequencies to generate a plurality of resultant values, each of said second trigonometric functions being the inverse of a corresponding one of said trigonometric functions, with the corresponding first and second trigonometric functions being at the same frequency; and summing said resultant values and generating an output signal.

16. A method for filtering an input comprising a pair of oscillation waveforms on respective first and second input channels, comprising:

generating first trigonometric functions at a plurality of predetermined frequencies;

multiplying each of said said oscillation waveforms with said first trigonometric functions at said plurality of predetermined frequencies to generate a plurality of products;

filtering said plurality of products, to generate oscillatory complex amplitude components thereof for each of said predetermined frequencies;

multiplying each of said oscillatory complex amplitude components by a corresponding predetermined value, to obtain new oscillatory complex amplitude components;

multiplying said new oscillatory complex amplitude components for each of said predetermined frequencies with a second trigonometric function at the corresponding one of said predetermined frequencies to generate a plurality of resultant values, each of said second trigonometric functions being the inverse of a corresponding one of said first trigonometric functions, with the corresponding first and second trigonometric functions being at the same frequency; and summing said resultant values, generating an output signal having real and imaginary parts, and outputting said real and imaginary parts as signals respectively on first and second output channels, which first and second output channels correspond respectively to said first and second input channels.

17. A method according to claim 16, wherein a first proportion of the signal on said first channel is applied to the second channel and a second proportion of the signal on the second channel is applied to the first channel.

18. A method of filtering an input comprising a pair of oscillation waveforms on respective first and second input channels, comprising:

generating first trigonometric functions at a plurality of predetermined frequencies;

multiplying each of said said oscillation waveform with said first trigonometric functions at said plurality of predetermined frequencies to generate a plurality of products;

filtering said plurality of products, to generate oscillatory complex amplitude components thereof for each of said predetermined frequencies;

varying the phase of each of said oscillatory complex amplitude components by a corresponding predetermined value, to obtain new oscillatory complex amplitude components;

multiplying said new oscillatory complex amplitude components for each of said predetermined frequencies with a second trigonometric function at the corresponding one of said predetermined frequencies to generate a plurality of resultant values, each of said second trigonometric functions being the inverse of a corresponding one of said first trigonometric functions, with the corresponding first and second trigonometric functions being at the same frequency; and summing said resultant values, generating an output signal having real and imaginary parts, and outputting said real and imaginary parts respectively on first and second output channels, which first and second output channels correspond respectively to said first and second input channels.

19. A method according to claim 18, wherein a first proportion of the signal on said first channel is applied to the second channel and a second proportion of the signal on the second channel is applied to the first channel.

20. A method of filtering an oscillation waveform, comprising:

generating first sine and cosine functions of said oscillation waveform at a plurality of predetermined frequencies;

filtering said first sine and cosine functions, to generate oscillatory components thereof for each of said predetermined frequencies;

multiplying each of said oscillatory components by a corresponding predetermined value, to obtain new oscillatory components;

multiplying said new oscillatory components for each of said predetermined frequencies with second sine and cosine function at the corresponding one of said predetermined frequencies to generate a plurality of resultant values, each of said second sine and cosine functions corresponding to one of said first sine and cosine functions, with the corresponding first and second sine and cosine functions being at the same frequency; and summing said resultant values and generating an output signal.

21. A method of filtering an oscillation waveform, comprising:

generating first sine and cosine functions of said oscillation waveform at a plurality of predetermined frequencies;

filtering said first sine and cosine functions to generate oscillatory components thereof for each of said predetermined frequencies;

varying the phase of each of said oscillatory components by a corresponding predetermined value, to obtain new oscillatory components;

multiplying said new oscillatory components for each of said predetermined frequencies with second sine and cosine functions at the corresponding one of said predetermined frequencies to generate a plurality of resultant values, each of said second sine and cosine functions corresponding to one of said first sine and cosine functions with the corresponding first and second sine and cosine functions being at the same frequency; and scanning said resultant values and generating an output signal.

22. A control apparatus for a rotor supported by an electromagnetic bearing comprising:

a X-direction servo circuit including an X-directional displacement detector arranged to detect an X-axial deviation of the rotor from a preset radial position and to generate a first oscillation waveform representing said X-axial deviation;

a Y-direction servo circuit including a Y-directional displacement detector arranged to detect a Y-axial deviation of the rotor from a preset radial position and to generate a second oscillation waveform representing said y-axial displacement;

a band pass filter device having:

first and second input channels for receiving said first and second oscillation waveforms respectively, means for generating first trigonometric functions at a plurality of predetermined frequencies;

means for multiplying each of said said oscillation waveforms with said first trigonometric functions at said plurality of predetermined frequencies to generate a plurality of products;

means for filtering said plurality of products, to generate oscillatory complex amplitude components thereof for each of said predetermined frequencies;

means for multiplying each of said oscillatory complex amplitude components by a corresponding predetermined value, to obtain new oscillatory complex amplitude components;

means for multiplying said new oscillatory complex amplitude components for each of said predetermined frequencies with a second trigonometric function at the corresponding one of said predetermined frequencies to generate a plurality of resultant values, each of said second trigonometric functions being the inverse of a corresponding one of said first trigonometric functions, with the corresponding first and second trigonometric functions being at the same frequency; and means for summing said resultant values, generating an output signal having real and imaginary parts, and outputting said real and imaginary parts as signals respectively on first and second output channels, which first and second output channels correspond respectively to said first and second input channels;

the control apparatus further comprising:

a first output circuit connected to said first output channel for generating a first control signal for controlling the X-axial position of the rotor so as to hold the rotor at the preset radial position; and a second output circuit connected to the second output channel for generating a second control signal controlling the Y-axial position of the rotor so as to hold the rotor at the preset radial position.

23. A control apparatus according to claim 22 the control apparatus further comprising:

a first output circuit connected to said first output channel for generating a first control signal for controlling the X-axial position of the rotor so as to hold the rotor at the preset radial position; and a second output circuit connected to the second output channel for generating a second control signal controlling the Y-axial position of the rotor so as to hold the rotor at the preset radial position.

24. A control apparatus for a rotor supported by an electromagnetic bearing comprising:

a X-direction servo circuit including an X-directional displacement detector arranged to detect an X-axial deviation of the rotot from a preset radial position and to generate a first oscillation waveform representing said X-axial deviation;

a Y-direction servo circuit including a Y-directional displacement detector arranged to detect a Y-axial deviation of the rotor from a preset radial position and to generate a second oscillation waveform representing said Y-axial displacement;

a band pass filter device having;

first and second input channels for receiving said first and second oscillation waveforms respectively;

means for generating first trigonometric functions at a plurality of predetermined frequencies;

means for multiplying each of said said oscillation waveforms with said first trigonometric functions at said plurality of predetermined frequencies to generate a plurality of products;

means for filtering said plurality of products, to generate oscillatory complex amplitude components thereof for each of said predetermined frequencies;

means for varying the phase of each of said oscillatory complex amplitude components by a corresponding predetermined value, to obtain new oscillatory complex amplitude components;

means for multiplying said new oscillatory complex amplitude components for each of said predetermined frequencies with a second trigonometric function at the corresponding one of said predetermined frequencies to generate a plurality of resultant values, each of said second trigonometric functions being the inverse of a corresponding one of said first trigonometric functions, with the corresponding first and second trigonometric functions being at the same frequency; and means for summing said resultant values and generating an output signal having real and imaginary parts, and outputting said real and imaginary parts respectively on first and second output channels, which first and second output channels correspond respectively to said first and second input channels.

the control apparatus further comprising:

a first output circuit connected to said first output channel for generating a first control signal for controlling the X-axial position of the rotor so as to hold the rotor at the preset radial position; and a second output circuit connected to the second output channel for generating a second control signal controlling the Y-axial position of the rotor so as to hold the rotor at the preset radial position.

25. A control apparatus according to claim 24 the control apparatus further comprising:

a first output circuit connected to said first output channel for generating a first control signal for controlling the X-axial position of the rotor so as to hold the rotor at the preset radial position; and a second output circuit connected to the second output channel for generating a second control signal controlling the Y-axial position of the rotor so as to hold the rotor at the preset radial position.

26. A control apparatus for a rotor supported by an electromagnetic bearing comprising:

a X-direction servo circuit including an X-directional displacement detector arranged to detect an X-axial deviation of the rotor from a preset radial position and to generate a first oscillation waveform representing said X-axial deviation;

a Y-direction servo circuit including a Y-directional displacement detector arranged to detect a Y-axial deviation of the rotor from a preset radial position and to generate a second oscillation waveform representing said Y-axial displacement;

a band pass filter device having; first and second input channels for receiving said first and second oscillation waveforms respectively, said band pass filter device being arranged to filter said first and second oscillation waveforms and generate first and second outputs on first and second output channels;

a first output circuit connected to said first output channel for generating a first control signal for controlling the X-axial position of the rotor so as to hold the rotor at the preset radial position; and a second output circuit connected to the second output channel for generating a second control signal controlling the Y-axial position of the rotor so as to hold the rotor at the preset radial position;

wherein said band pass filter device is arranged to generate first and second intermediate signals, to pass at least a first proportion of said first intermediate signal and at least a second proportion of said second intermediate signal to the first output channel and to pass at least a third proportion of said second signal and at least a fourth proportion of said first signal to said second output channel, and the band pass filter includes means for varying at least the second proportion of said second intermediate signal passed to said first channel and the fourth proportion of said first intermediate signal passed to said second channel respectively.

* * * * *